(12) United States Patent
Vandenbrouck et al.

(10) Patent No.: US 10,997,784 B2
(45) Date of Patent: May 4, 2021

(54) GENERATING SPACE MODELS FROM MAP FILES

(71) Applicant: Microsoft Technology Licensing, LLC, Redmond, WA (US)

(72) Inventors: Grégory Christopher John Vandenbrouck, Bellevue, WA (US); Fernando Nahuel Viton, Kirkland, WA (US); Matthew Evan Vogel, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 6 days.

(21) Appl. No.: 16/224,574

(22) Filed: Dec. 18, 2018

(65) Prior Publication Data

US 2020/0193700 A1 Jun. 18, 2020

(51) Int. Cl.
*G06T 17/05* (2011.01)
*G06F 3/0481* (2013.01)
(Continued)

(52) U.S. Cl.
CPC .......... *G06T 17/05* (2013.01); *G06K 9/00476* (2013.01); *G06T 11/206* (2013.01);
(Continued)

(58) Field of Classification Search
CPC ............................ G06T 17/05; G06F 3/04815
See application file for complete search history.

(56) References Cited

U.S. PATENT DOCUMENTS

| 6,622,085 B1 | 9/2003 | Amita et al. |
| 2005/0086612 A1* | 4/2005 | Gettman ............. G06F 3/04815 715/848 |

(Continued)

FOREIGN PATENT DOCUMENTS

JP 2002032773 A 1/2002

OTHER PUBLICATIONS

"Processing of GeoJson data in R", Retrieved From: https://cran.r-project.org/web/packages/geojsonR/vignettes/the_geojsonR_package.html, Retrieved Date: Oct. 13, 2018, 10 Pages.

(Continued)

*Primary Examiner* — Yi Yang
(74) *Attorney, Agent, or Firm* — Holzer Patel Drennan

(57) ABSTRACT

A map file includes two-dimensional or three-dimensional geometric data items collectively representing layout of a building. The map file and parsed and the geometric data items analyzed to identify building elements including rooms, floors, and objects of the building, and to identify containment relationships between the elements. A space model having a space graph is constructed. The space graph includes nodes that correspond to the respective building elements and links forming relationships between nodes that correspond to the identified containment relationships. Each node may include node metadata, rules or code that operate on the metadata, and a node type that corresponds to a type of physical space. Some nodes may include user representations or device representations that represent physical sensors associated therewith. The representations may receive data from the respectively represented sensors, and the sensor data becomes available via the space model.

20 Claims, 10 Drawing Sheets

(51) Int. Cl.
*G06K 9/00* (2006.01)
*G06T 11/20* (2006.01)
*H04L 12/24* (2006.01)
*G06F 3/0484* (2013.01)
*H04L 29/08* (2006.01)

(52) U.S. Cl.
CPC ........ *H04L 41/145* (2013.01); *G06F 3/04845* (2013.01); *G06K 2209/01* (2013.01); *G06K 2209/27* (2013.01); *G06T 2200/24* (2013.01); *H04L 67/10* (2013.01)

(56) References Cited

U.S. PATENT DOCUMENTS

| | | |
|---|---|---|
| 2005/0203937 A1 | 9/2005 | Nomura |
| 2007/0185651 A1 | 8/2007 | Motoyama et al. |
| 2010/0328684 A1* | 12/2010 | Cain .................. G06F 3/1212 358/1.2 |
| 2011/0126158 A1* | 5/2011 | Fogarty ................ G06F 8/75 715/835 |
| 2012/0086568 A1* | 4/2012 | Scott .................. G05B 15/02 340/501 |
| 2017/0123382 A1 | 5/2017 | Ruzicka et al. |
| 2017/0262742 A1* | 9/2017 | Verhofstad ......... G06K 15/1843 |
| 2017/0315697 A1* | 11/2017 | Jacobson ............... G06F 16/26 |
| 2018/0284736 A1 | 10/2018 | Cella et al. |
| 2020/0004843 A1 | 1/2020 | Valegerepura et al. |

OTHER PUBLICATIONS

"Process GeoJSON map files", Retrieved From: https://docs.servicenow.com/bundle/kingston-service management-for-the-enterprise/page/product/facilities-service-management/task/t_ProcessMapFiles.html, Retrieved Date: Oct. 13, 2018, 3 Pages.

Belimpasakis, et al., "A Combined Mixed Reality and Networked Home Approach to Improving User Interaction with Consumer Electronics", In Journal of IEEE Transactions on Consumer Electronics, vol. 57, Issue 1, Feb. 21, 2011, pp. 139-144.

Jeong, et al., "AVIoT: Web-Based Interactive Authoring and Visualization of Indoor Internet of Things", In Journal of IEEE Transactions on Consumer Electronics, vol. 61, Issue 3, Aug. 2015, pp. 295-301.

"International Search Report and Written Opinion Issued in PCT Application No. PCT/US2019/064563", dated Mar. 26, 2020, 11 Pages.

Pfisterer et al., "SPITFIRE: Toward a Semantic Web of Things", In Journal of IEEE Communications Magazine, vol. 49, Issue 11, Nov. 10, 2011, pp. 40-48.

Reitmayr et al., "Semantic World Models for Ubiquitous Augmented Reality", In Proceedings of the Workshop towards Semantic Virtual Environments (SVE), Mar. 16, 2005, 10 Pages.

* cited by examiner

GENERATING SPACE MODELS FROM MAP FILES

BACKGROUND

Recent advances in cloud technology and Internet of Things (IoT) hardware and software has made it inexpensive and convenient to put sensors in physical spaces and then collect information about the physical spaces. To provide information to a facility manager, sensors such as thermostats, lighting controls, motion sensors, etc. may be placed in a building's rooms and furniture. The facility manager may wish to see what rooms have what resources or see statistics about how the rooms or resources are being used. For large facilities with many sensors, this can be difficult. Furthermore, it can be difficult to meaningfully aggregate, synthesize, and analyze the information from the many sensors in a physical space such as a building. Consequently, a need has arisen for tools to model physical spaces and the devices and people within them. The information provided by a schematic or graph model of a space can allow new kinds of insights into the effectiveness of equipment, utilization of spaces, costs, efficiency, etc.

Cloud providers have developed complex space modeling tools for cloud tenants to use to schematically model physical spaces, people, devices, and their relationships. See, for instance, Azure Digital Twins™ available from Microsoft Corporation. A tenant may author a space model that models a physical space. The space model then facilitates integration of IoT devices with a cloud and synthesis of IoT sensor data. The space model may be executed and managed by the cloud and may have interfaces or facilities for communicating with IoT devices. The space model may model the locations of IoT devices within the corresponding physical space.

Space modeling techniques have been helpful for managing and organizing information about a physical space, synthesizing metadata about a physical space, providing the information about a physical space to other systems, etc. However, space models have been difficult to construct. Because a space model models logical relationships (e.g., containment) between elements and contents of a physical space or building, construction of the space model is challenging. Typically, a user will refer to a map of a physical space and attempt to visually discern the elements and relationships of the physical space. Depending on the type of map, this can be particularly difficult. If the map is a computer-assisted drawing (CAD) file, the map may have significant complexity and layers of information that are difficult to navigate and interpret. Just identifying the elements of a space, e.g., rooms and equipment, can be challenging. When an element such as a building floor has been identified, it may difficult to discern properties of that element. For example, it may not be easy to identify the name or type of an element (e.g., a room). In short, creating a space model has been a time-consuming and error-prone process.

Techniques related to constructing space models from map files and other information are discussed below.

SUMMARY

The following summary is included only to introduce some concepts discussed in the Detailed Description below. This summary is not comprehensive and is not intended to delineate the scope of the claimed subject matter, which is set forth by the claims presented at the end.

A map file includes two-dimensional or three-dimensional geometric data items collectively representing layout of a building. The map file and parsed and the geometric data items analyzed to identify building elements including rooms, floors, and objects of the building, and to identify containment relationships between the elements. A space model having a space graph is constructed. The space graph includes nodes that correspond to the respective building elements and links forming relationships between nodes that correspond to the identified containment relationships. Each node may include node metadata, rules or code that operate on the metadata, and a node type that corresponds to a type of physical space. Some nodes may include user representations or device representations that represent physical sensors associated therewith. The representations may receive data from the respectively represented sensors, and the sensor data becomes available via the space model.

Many of the attendant features will be explained below with reference to the following detailed description considered in connection with the accompanying drawings.

BRIEF DESCRIPTION OF THE DRAWINGS

The present description will be better understood from the following detailed description read in light of the accompanying drawings, wherein like reference numerals are used to designate like parts in the accompanying description.

DETAILED DESCRIPTION

Figure 1:
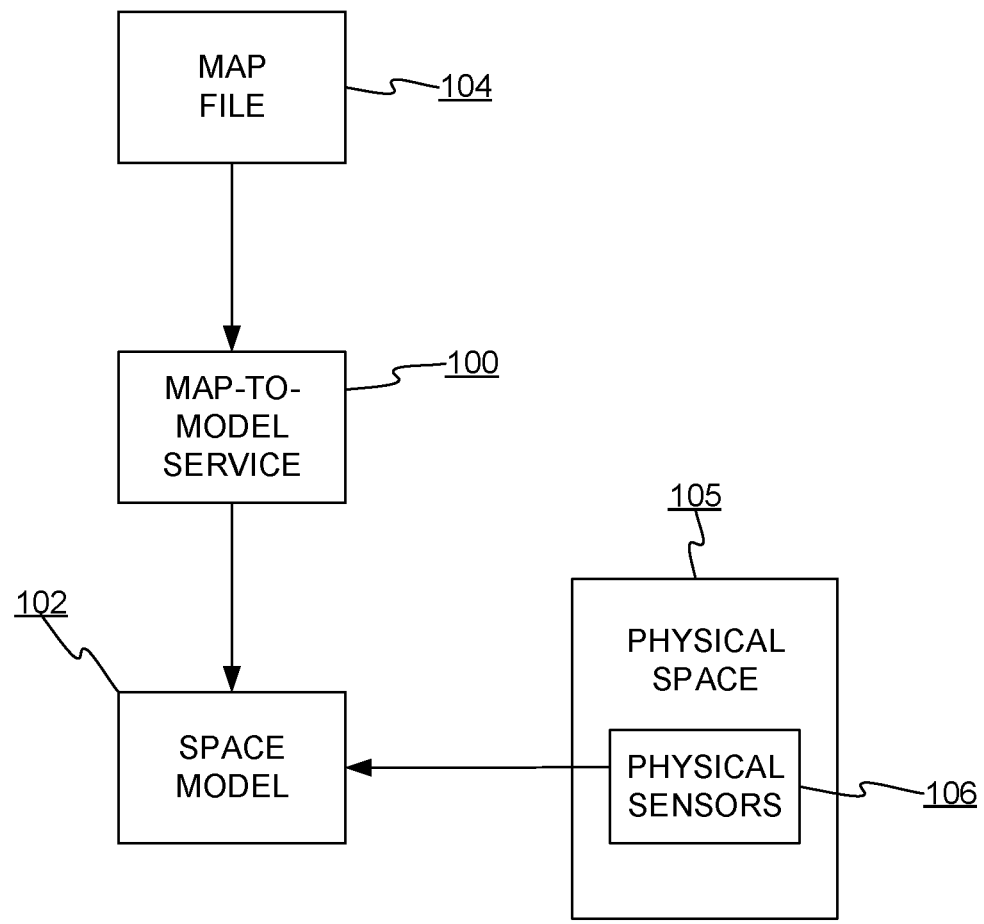
FIG. 1 shows a map-to-model service producing a space model from a map file.

FIG. 1 shows a map-to-model service 100 producing a space model 102 from a map file 104. The space model 102 models a physical space 105 that is equipped with physical sensors 106 and which contains users. The physical sensors 106 measure aspects of their respective local physical spaces such as temperature, motion detection, sensed sound, light, etc. The sensors pass their measurements to the space model 102 via a communication pathway which may involve a local IoT device such as a hub or edge device, which in turn passes measurements to a cloud which then provides the measurements to the space model 102. Details of these components are described below.

Figure 2:
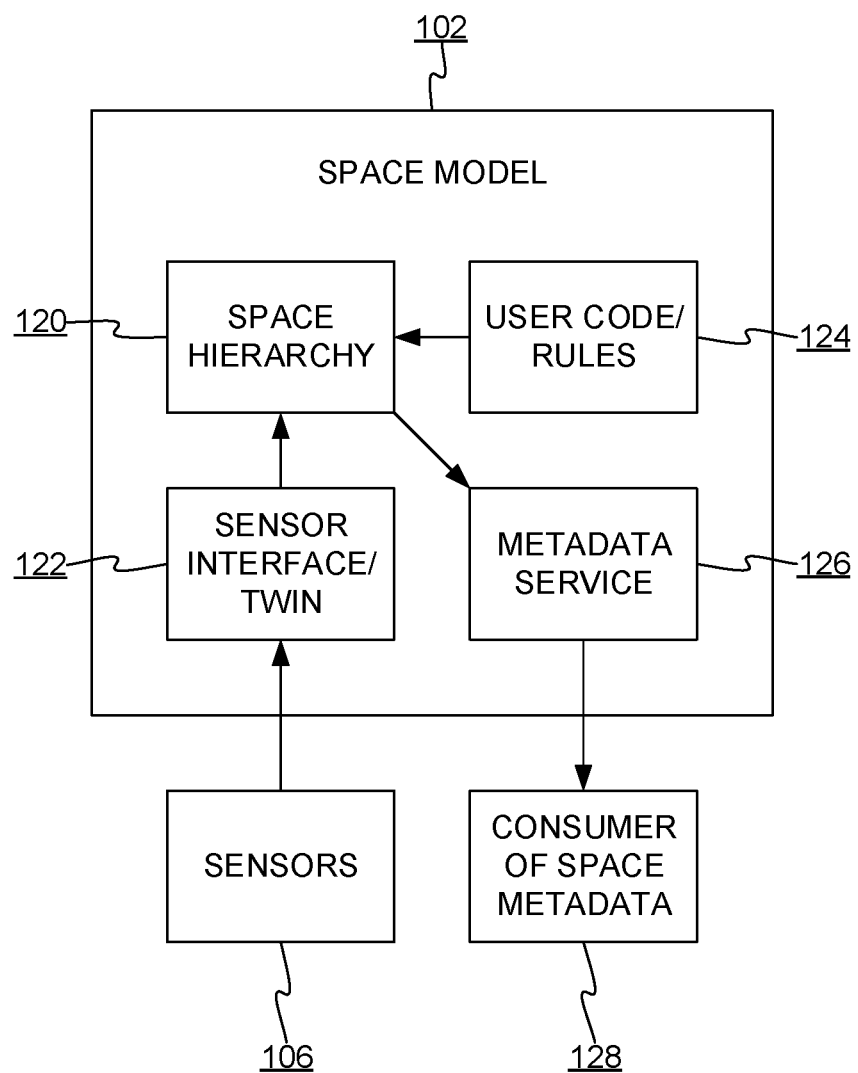
FIG. 2 shows an overview of components of a space model.

FIG. 2 shows an overview of components of a space model 102. The space model 102 may be provided by a cloud service, as discussed further below. Users or tenants generate the space model 102 using the map-to-model service 100 and revise or edit the space model 102 as needed. The space model 102 is then stored and implemented by the cloud.

A salient feature of the space model 102 is the space hierarchy 120. The space hierarchy 120 is a tree or graph that models the relationships between space elements such as buildings, floors, and rooms, for example. The space hierarchy 120 reflects the relationships between place/location elements, but without concern for two-dimensional or three-dimensional locations. In short, the space hierarchy 120 is a relationship graph, not a spatial map. The space hierarchy 120 is described in detail with reference to FIG. 3.

The space model 102 also includes sensor interfaces 122. A sensor interface 122 is generated for each physical sensor 106. The sensor interfaces 122 mirror state of the respective sensors, store and possibly translate measures from the sensors, and provide the sensor state and readings to the space hierarchy 120. The sensor interfaces 122 may be associated with or contained by elements or nodes of the space hierarchy 120, thus locating them within the hierarchy. When a sensor 106 is added to the space model 102, a corresponding sensor interface 122 (or digital representation) is added to an element in the space hierarchy 120. In short, each interface 122 takes in measures or inputs from a corresponding sensor and introduces the measures or inputs to the space hierarchy 120, preferably in association with a particular node in the space hierarchy 120 that corresponds to an intended relational location of the sensor.

The space model 102 further includes user code 124 (or rules). The user code 124 specifies behaviors or actions taken based on state of the space hierarchy 120. A rule or piece of code is inputted by a user in association with a user-specified element of the space hierarchy. The code may be triggered by updates to the relevant hierarchy element or subtrees or elements contained by the element, or the code may monitor the state of its element. In either case, the code evaluates the state of its element and depending thereon may take some action such as generating an event, updating state of the space hierarchy 120, communicating with the cloud, and so forth.

Finally, the space model 102 includes a metadata service 126. The metadata service 126 provides metadata of the space hierarchy 120 to any client or metadata consumer 128. The metadata service 126 may implement a publish/subscribe model, and/or a query service. In the publish/subscribe case, a consumer 128 subscribes to the space hierarchy 120 or elements thereof, possibly with a filter or other means to specify particular parts of the space hierarchy 120. In the query case, a consumer 128 submits metadata queries to the metadata service 126, which searches the space hierarchy 120 for the metadata described in the query and returns the metadata to the consumer 128.

Figure 3:
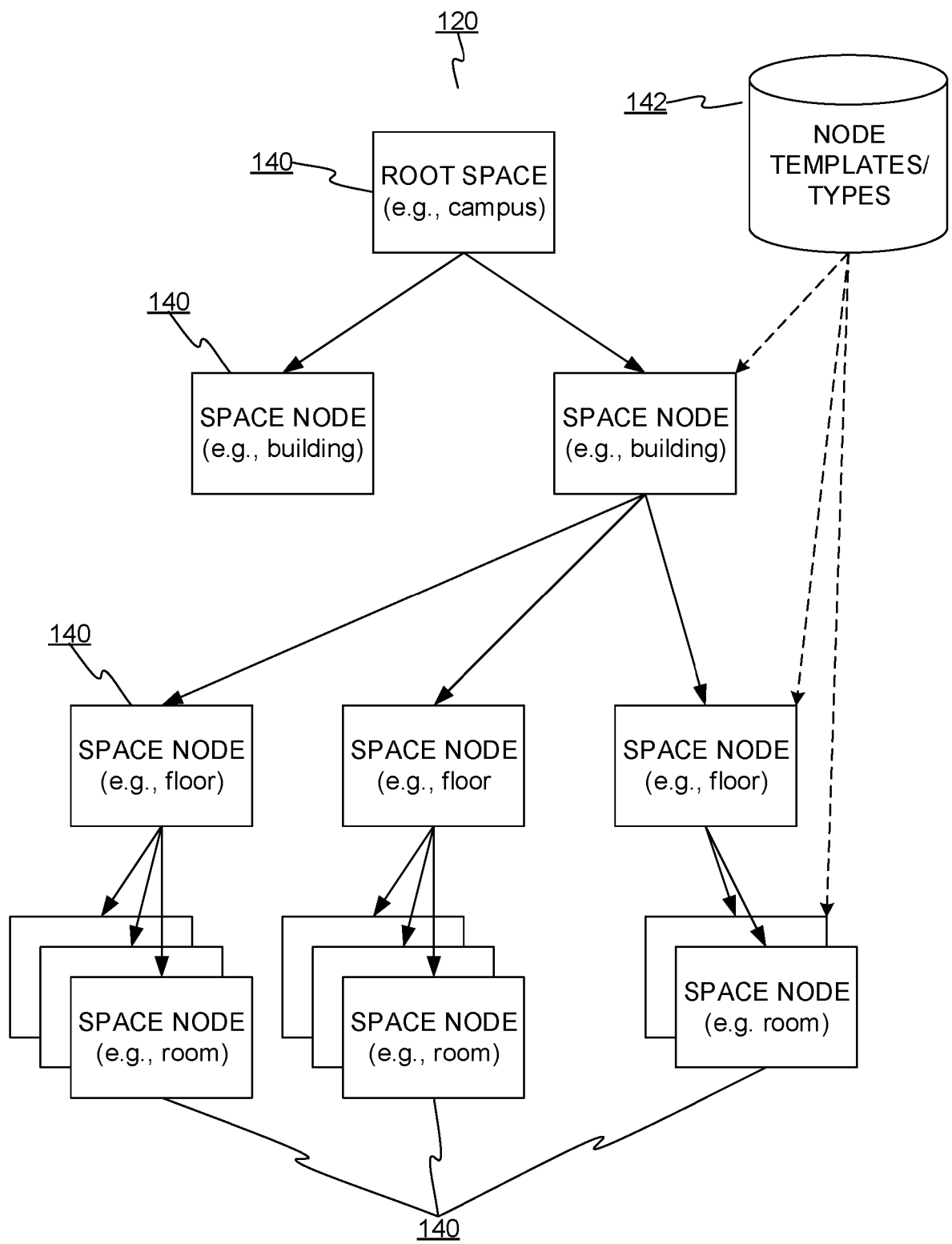
FIG. 3 shows details of a space hierarchy.

FIG. 3 shows details of a space hierarchy 120. As noted above, the space hierarchy is a data structure that models the containment relationships of places or structures, where nodes 140 represent the places or structures. Techniques for implementing a tree or graph data structure are well known and described elsewhere. Nodes 140 may be set to have types predefined in a template database 142 provided by the cloud service, for instance a street block or campus, building, floor, room, etc. The template database may also include preconfigured space hierarchies, for instance basic building templates. Each type of node may have metadata fields common to all nodes as well as metadata fields specific to the type of node. Furthermore, some nodes may have metadata fields whose values depend on the values of the same metadata fields of child nodes. For example, if several leaf nodes (e.g., rooms) are contained by a same parent node (e.g., a floor), the parent node may have a temperature metadata value that is an aggregation of its child nodes (or subtrees, as the case may be). In other words, some metadata values for nodes may be a statistical synthesis or sum of the values in the nodes it contains.

Some sensors linked to the space hierarchy 120 may be interactive, i.e., activatable by a user. Such input may set a value of a metadata field in a space node through a corresponding sensor interface attached to the corresponding space node. The input from the sensor may influence the state of the space hierarchy, which in turn may trigger events to be outputted by the metadata service or certain values to be returned by queries to the metadata service.

Although not shown in FIG. 3, a space model may also have objects to represent persons/users or other things within the physical space. A user object may have identity information, credentials, and a role, all of which can be used to perform authentication and control access to nodes or other elements of the space model 120.

Figure 4:
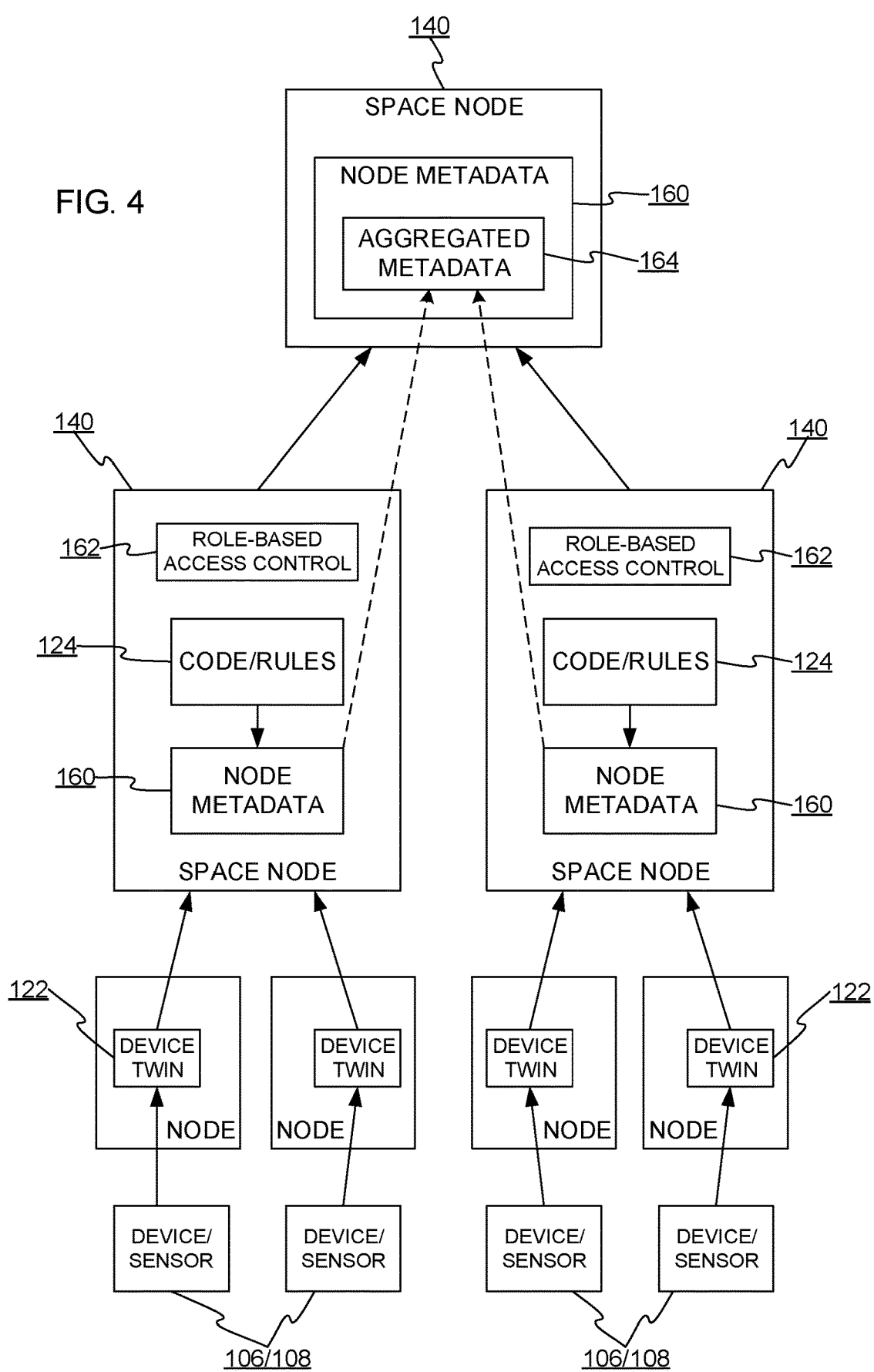
FIG. 4 shows details of space nodes in a space hierarchy.

FIG. 4 shows details of space nodes 140 in a space hierarchy 120. As noted above, each node may have node metadata 160, which may include user-defined fields and predefined fields per the typing of a node. Some metadata fields may be populated by or linked to device or sensor interfaces 122. As also noted above, a node may contain user-authored code or rules keyed to the metadata of the hosting node (and/or other nodes). The code or rule may specify conditions of metadata parameters and actions to be taken, such as modifying a metadata field, generating an event, communicating with a cloud service, and the like. The nodes may also have modules for role-based access control 162. For instance, access control lists may be used to determine who is allowed to read or modify metadata or load code into a node for execution. The access control mechanism may also be used to control who can add a device representation (sensor interface), what types of interfaces can be added, etc.

As discussed above, a node's metadata may have an aggregated metadata 164 value (perhaps implicit) that is a product of the same metadata field instances in the contained nodes. The aggregated metadata 164 may also have aggregation rules to define how values below are aggregated. For example, if there is a Boolean metadata field (e.g., "occupied" or "person present"), a value of "true" or "false" is straightforward for leaf nodes. Parent nodes containing nodes with such fields may need a rule to determine how the metadata field is to be determined. Referring to the "occupied" example, a container node may set its "occupied" field to "true" if a certain number of the fields in its child nodes are true. Similarly, for temperature, a "floor" node might set its "temperature" field to an average of the temperatures of its child nodes.

Figure 5:
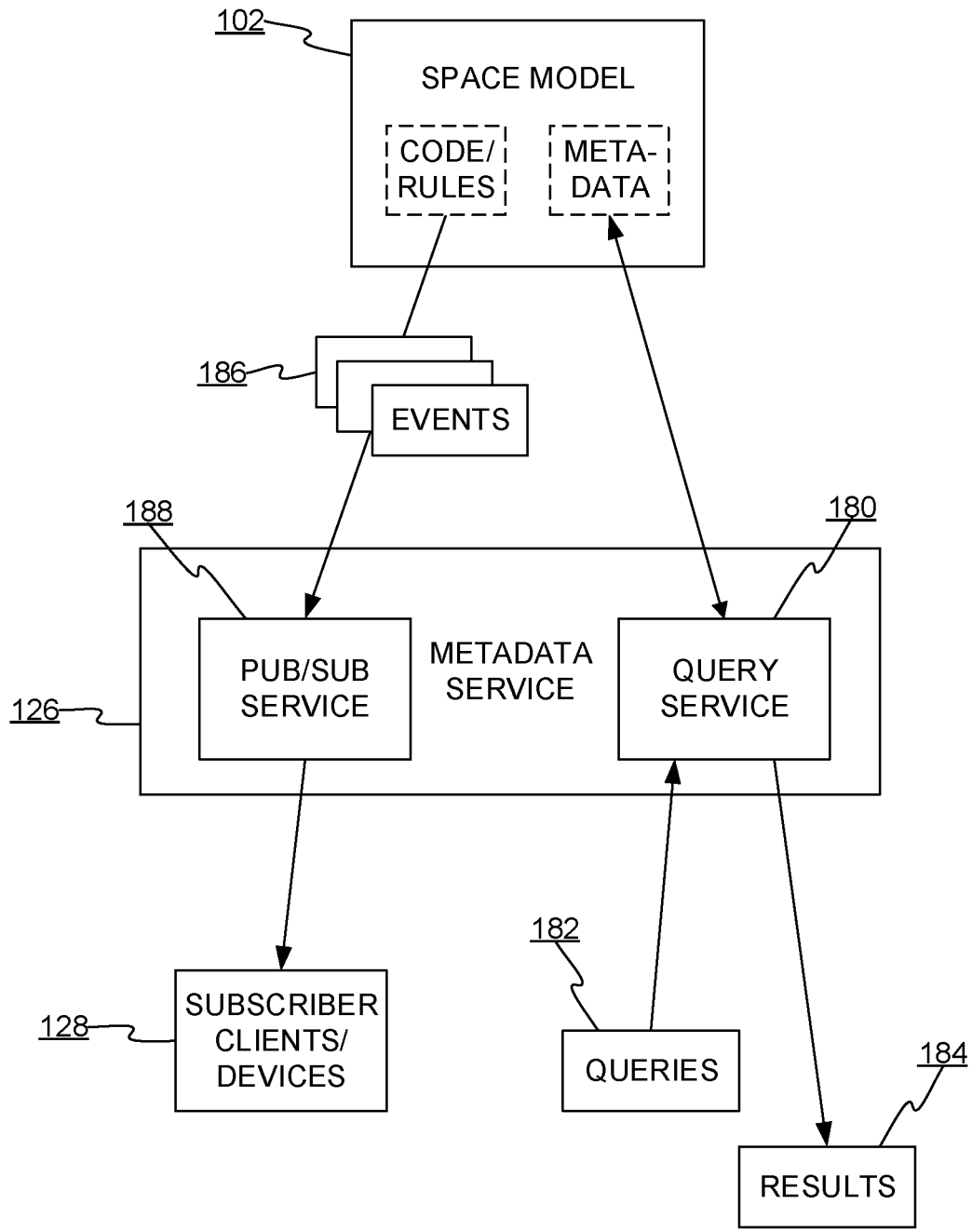
FIG. 5 shows the metadata service providing data about a space model to clients or devices.

FIG. 5 shows the metadata service 126 providing data about the space model 120 to clients or devices communicating with the metadata service 126. In a query-based embodiment, the metadata service 126 includes a query service 180. The query service 180 receives metadata queries 182 specifying combinations of parameters such as a particular node (place), a type of node, a represented sensor or device, a type of metadata, and/or a node having a specified feature or containing a specified item, etc. The query service 180 parses through the space model 120 to find the specified metadata, and a corresponding result 184 is returned to the requestor (e.g., a mixed reality system). In a publish/subscribe model, a subscriber (e.g., a mixed reality system) submits a subscription request specifying events desired to be received. The request may include parameters similar to those of a query, but to filter which events are received. Consequently, the subscriber receives an event when code running in the space model generates an event and the event meets the subscriber's requirements. Queries and event filters may specify, for example, whichever node contains a particular mobile object or user.

Figure 6:
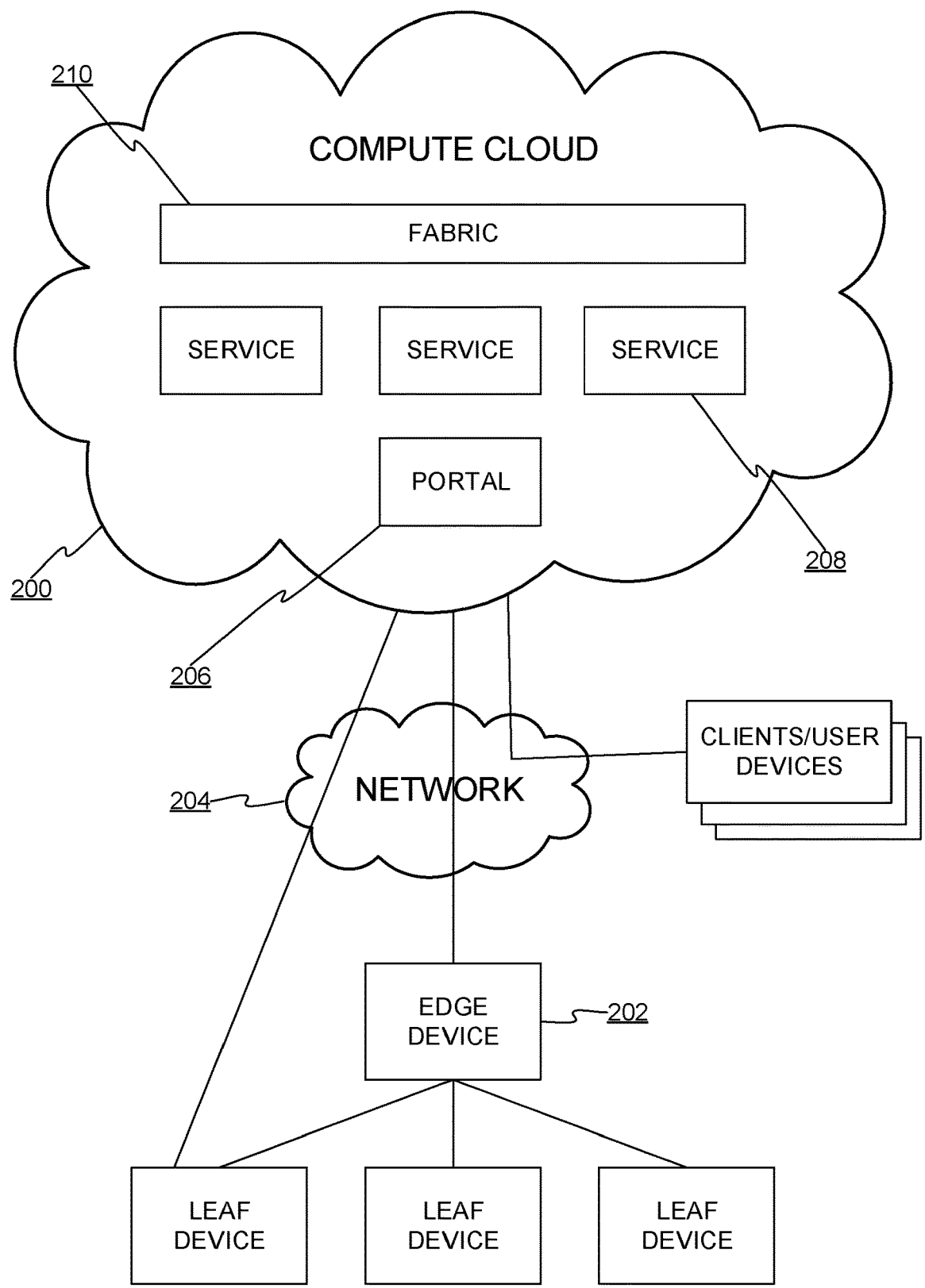
FIG. 6 shows an example of a compute cloud.

FIG. 6 shows an example of a compute cloud 200 communicating with an edge device 202 via a network 204. The compute cloud 200 may include a variety of components communicating on an internal network of the cloud 200. To that end, the cloud 200 may implement a variety of architectures, including Infrastructure as a Service (IaaS), Platform as a Service (PaaS), serverless computing, Software as a Service (Saas), or combinations thereof. Examples of common clouds are Microsoft Azure™, Amazon Web Services™, Google Cloud™, to name a few. Regardless of its software architecture and how it is presented to users, the cloud 200 will include a variety of hardware assets such as datacenters with servers, networking devices interconnecting servers (many having virtualization stacks for executing VMs) and datacenters, storage systems, VM management tools, and so forth.

The cloud 200 may include a portal 206 or web/console frontend through which tenants or users of the cloud 200 may be presented with a graphical user interface for reserving or purchasing cloud resources, uploading or configuring workloads to execute on the cloud 200, subscribing to and accessing cloud services 208, working with telemetry data, registering and provisioning devices such as the edge device 202, accessing user interfaces for respective cloud services 208, and other known functions. Cloud services 208 may have application programming interfaces (APIs) invocable from within the cloud 200 as well as by external devices such as the edge device 202. The APIs may be specific to the particular cloud 200 but are implemented with known application-layer protocols such as the hypertext transport protocol (HTTP, perhaps with a RESTful architecture). The various services for space modeling and generating models from maps described herein may be implemented as cloud services 208.

The cloud 200 may include a fabric 120 for managing the cloud, enabling components or services 200 to cooperate, managing and allocating resources, etc. The services 208 may include a database service, an abstract/blob data storage service, machine learning services, search/indexing services, identity management services, IoT services, backup services, networking services, web services, and/or others.

Figure 7:
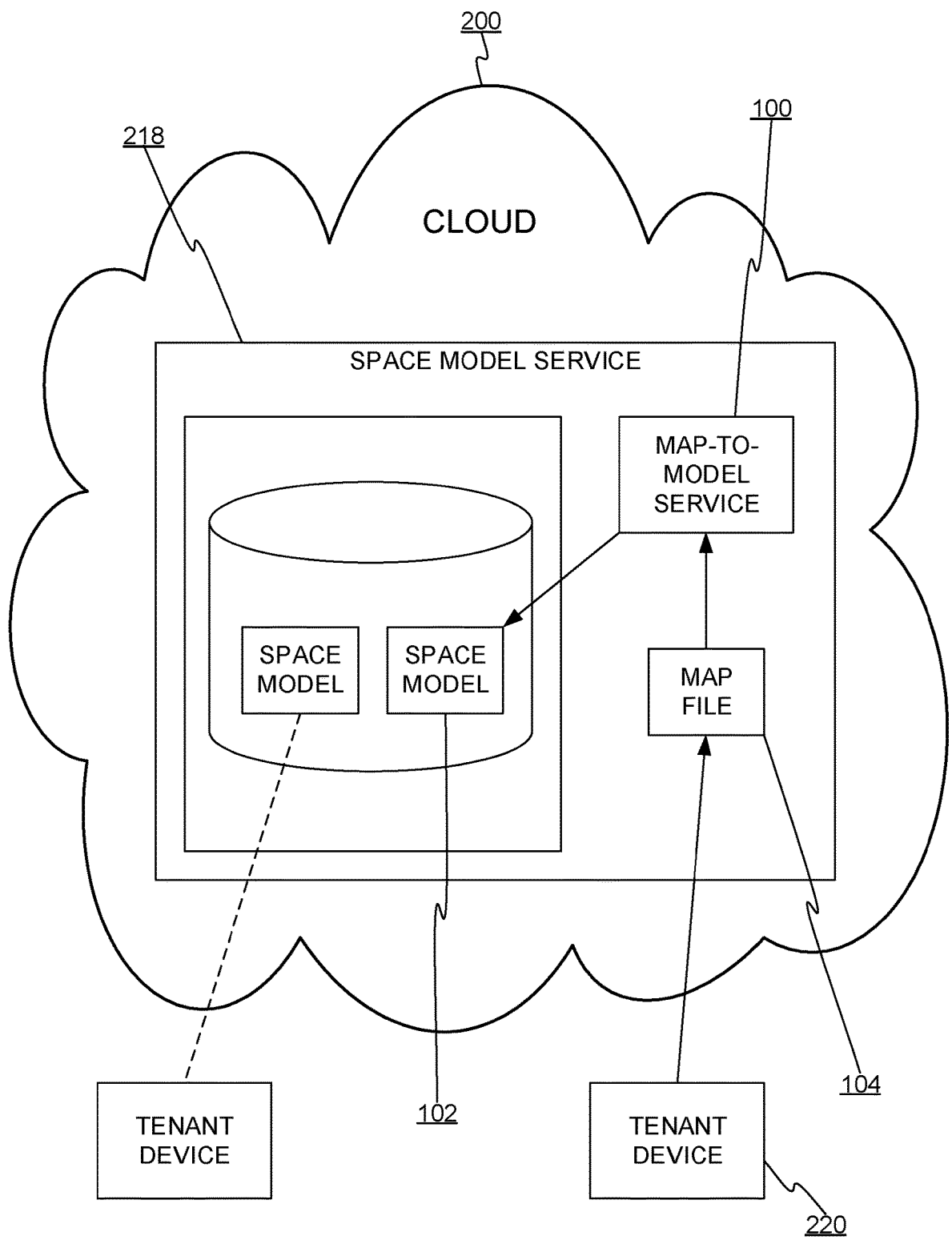
FIG. 7 shows the map-to-model service in the context of a cloud.

FIG. 7 shows the map-to-model service 100 in the context of a cloud 200. As noted, a space model service 218 and a map-to-model service 100 may be implemented as services in the cloud 200. The space model service 218 may manage space models for many respective cloud tenants. To begin the process of auto-generating a space model, a tenant device 220 submits the map file 104 to the map-to-model service 100. The map file may be imported to the cloud or obtained from a cloud storage service. The map-to-model service 100 then generates a new space model 102 from the map file 104. The map-to-model service 100 need not be a cloud service. An application or script on single user device can perform the same function, perhaps invoking PaaS APIs of the space model service 218 to instantiate the necessary objects.

As noted above, although not required, the map file 104 preferably is a non-raster format with discrete geometric constructs such as points, lines, polygons, splines, etc., with coordinates placing and orienting such constructs relative to each other in a two- or three-dimensional space. In one embodiment the map file 104 is a mesh model of a building or other space. In other embodiments, the map file 104 is a CAD file, an SVG file, a geoJSON (geospatial javascript Object Notation) file, or the like. The geometric/spatial information in the map file 104 may be two-dimensional or three-dimensional. As described below, the map-to-model service 100 parses the map file and applies algorithms and heuristics to identify space elements such as buildings, floors, rooms, hallways, etc., as well as relationships between them. This information is then used to construct a new space model 102 with a space hierarchy that mirrors the information in the map file 104.

Figure 8:
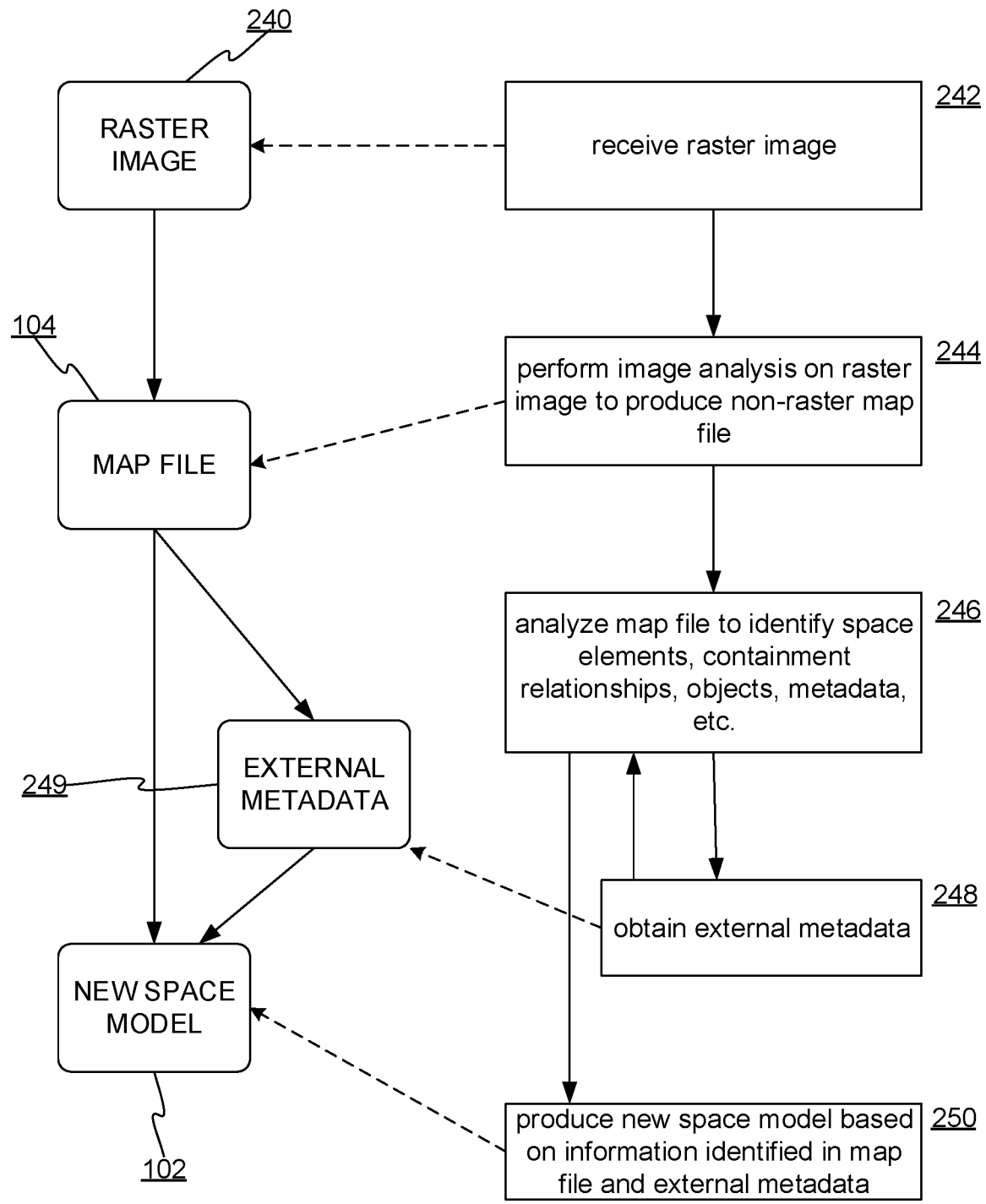
FIG. 8 shows a process for generating a new space model from a map file.

FIG. 8 shows a process for generating a new space model 102 from a map file 104. The process may be performed by the map-to-model service 100 and/or the space model service 218. Optionally, a raster image 240 is received at step 242. The raster image 240 consists of image data that describes the colors of individual pixels. At step 244 the raster image 242 is analyzed to produce the non-raster map file 104. Step 244 may involve known image analysis operations such as recognizing lines, edges, points, polygons, objects, and so forth. An optical character recognition (OCR) algorithm may also be applied to recognize text in the raster image 240.

As noted above, the map file 104 may be provided by a tenant as original data without the use of a raster image 240 (although the map file may be referred to herein as a non-raster file, it many nonetheless contain raster image data pieces associated with respective geometric elements of the map file). Regardless of the source of the map file 104, at step 246 the geometric-spatial data in the map file is analyzed to identify space elements, containment relationships, objects, metadata, and so forth. The map file may have a mix of geometric cues (corners, shape of object, etc.) that can inform how to map to a graph. Computer vision algorithms can be used to identify shapes and containment relationships between shapes. Machine learning algorithms can take in map files and respective finalized space models to learn and improve the map-to-model conversion process. Space elements that can be identified may include elements other than geometric features such as rooms and floors. Identified space elements may be devices, building fixtures, furniture, and the like.

At step 248 external metadata 249 may be queried or incorporated. External metadata may come from other cloud services, other files such as spreadsheets or text documents, databases of building information, and other sources associated with the map file or its contents. Queries of the external metadata may be formulated based on content of the map file. For example, if the map file includes a label "room 33" in association with a polygon, an external source can be queried for information about room 33. This information can in turn help decide the space/node type of the corresponding space node being added to the space model (e.g., media room, teleconference room). Such metadata within the map file 104 may be used in a similar fashion. Inferential heuristics can also be applied to the available metadata to derive and assign metadata to the nodes of the space hierarchy and can inform containment decisions.

Finally, at step 250, the new space model 102 is constructed based on the map file, metadata, and analysis of same. Specifically, new nodes are instantiated as per the space elements identified in the map file, and the nodes are formed into a graph per the containment relations derived at step 246. Some nodes may be generated based not on a corresponding geometric portion of the map file, but rather based on information about the space. For example, if a floor is found but no building, a building node may nonetheless be added to contain the relevant floor node. Nodes may also be inferred from the presence of objects such as devices or fixtures. If a floor is discerned in a map file and a commode is found in the map of the floor, then a bathroom room node may be inferred and added as a child node of the floor node (and containing the object that prompted its insertion). As noted above, space nodes may be instantiated for objects discerned from the map file and/or relevant metadata, e.g., fixtures, devices, furniture, etc. Such space nodes will often be represented by leaf nodes in the space model's graph.

Nodes may be typed and filled with node metadata and device representations as discussed above. Note that containment relationships can also inform node typing decisions; certain types of parent nodes will be expected to have only certain types of child nodes (e.g., a floor may contain a room but not a building). Typing can be performed by weighting and combining multiple such clues to find the most probable type. It is also possible to insert predefined user roles and user code, depending on the type of space (e.g., a type of building) or node. Parts of a map file or raster file may also be added to nodes. For instance, if the map file is a CAD file that contains a three-dimensional model of a device in a room, the model may be added to the node that represents the room.

The steps in FIG. 8 may optionally be implemented in conjunction with a wizard-like user interface that walks a user through the process. For example, there may be prompts for the locations of map/raster files and metadata sources, information about the new space model (e.g., what kind of space is being modeled), and so forth. At the end of step 250 the user may be guided into a user interface for editing space models, thus allowing correction of errors that occur during the conversion process.

To facilitate conversion of many types of map files, the process may include a converter that converts different types of map files to a single type of map file (e.g., geoJSON). This allows the same analysis and conversion algorithm to be applied to different types of map files.

Figure 9:
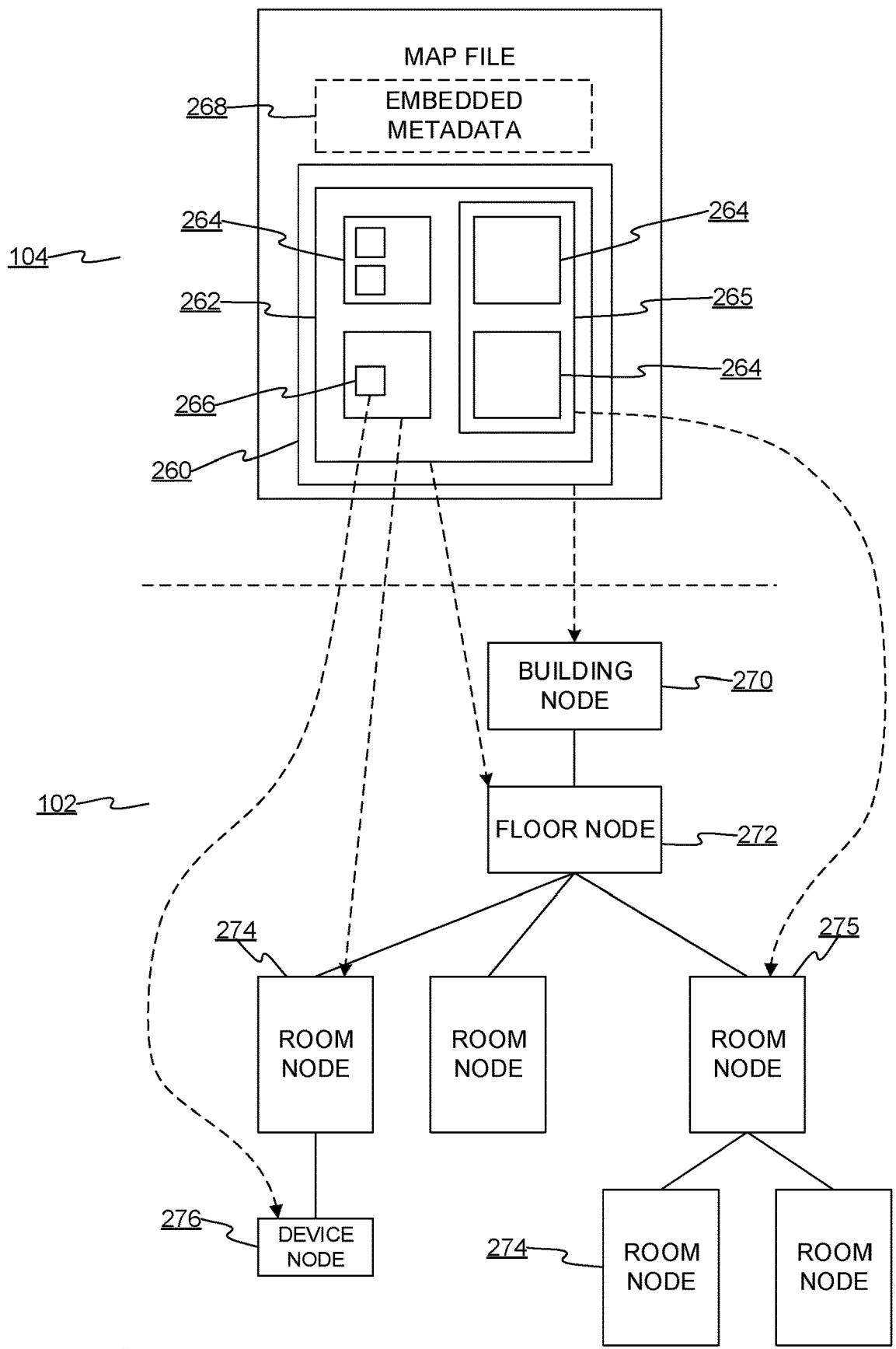
FIG. 9 shows an example of a space model auto-generated from a map file.

FIG. 9 shows an example of a space model 102 auto-generated from a map file 104. The map file 104 contains scalable two- or three-dimensional geometric data or constructs as discussed above. In this example, the map file includes building geometry 260, floor geometry 262, room geometry 264, 265, and indicia of devices 266 or other objects such as fixtures, furniture, etc. The map file may also include embedded metadata 268, which can be any information (e.g., plain or encoded text information) related to the content of the map file. The embedded metadata can be used as discussed above, and may include file metadata, information about the map file but not necessarily its map content (e.g., a title, keyword list, a name of an asset that the map corresponds to, links to related map files, etc.), user identities associated with the map file (which can be used for generating initial access control lists for the space model), metadata associated with geometric objects in the map file, etc.

The map file 104 is passed through the analysis and conversion process. The embedded metadata 268 and geometric constructs are parsed and loaded into memory. The geometric properties and cues of the geometry data are analyzed to identify spaces and containment relationships. The geometry as well as internal and external metadata are heuristically analyzed to infer the structure and content of the new space model 102. Based on the map file 104, the new space model's space graph includes a building node 270 to represent the building geometry 260, a floor node 272 to represent the floor geometry 262, room nodes 274 to represent the room geometry 264, a room node 275 to represent a room containing other rooms (and node links to reflect the relationships), and a device representation 276 to represent the indicated devices 266. The nodes may be typed and populated with node metadata. The nodes are linked to reflect the identified relationships among the relevant geometric objects in the map file. The new space model 102 may be instantiated as an object managed by the cloud's space model service 218, thus becoming available for receiving data from physical sensors, answering queries by the metadata service, providing analytics and statistics about the modeled space, and so forth.

Figure 10:
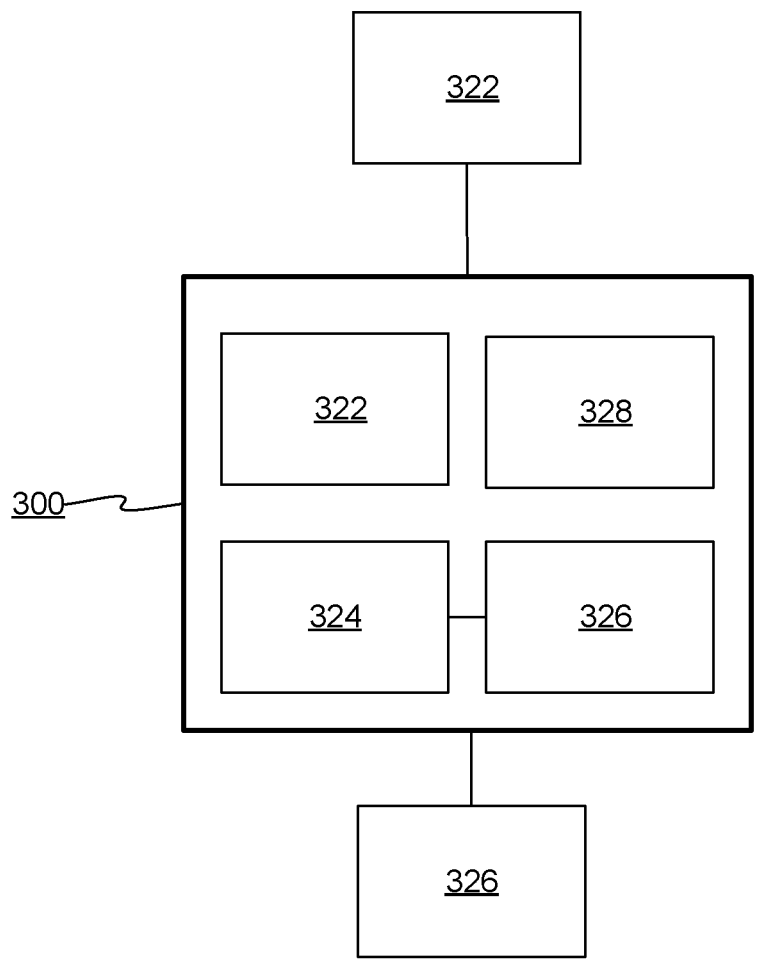
FIG. 10 shows details of a computing device on which embodiments described herein may be implemented.

FIG. 10 shows details of a computing device 300 on which embodiments described above may be implemented. Cloud servers, edge devices, leaf devices, and other devices discussed or implied above may more or less mirror the computing device 300. The technical disclosures herein will suffice for programmers to write software, and/or configure reconfigurable processing hardware (e.g., field-programmable gate arrays (FPGAs)), and/or design application-specific integrated circuits (ASICs), etc., to run on the computing device or host 300 (possibly via cloud APIs) to implement the embodiments described herein.

The computing device or host 300 may have one or more displays 322, a network interface 324 (or several), as well as storage hardware 326 and processing hardware 328, which may be a combination of any one or more of: central processing units, graphics processing units, analog-to-digital converters, bus chips, FPGAs, ASICs, Application-specific Standard Products (ASSPs), or Complex Programmable Logic Devices (CPLDs), etc. The storage hardware 326 may be any combination of magnetic storage, static memory, volatile memory, non-volatile memory, optically or magnetically readable matter, etc. The meaning of the term "storage", as used herein does not refer to signals or energy per se, but rather refers to physical apparatuses and states of matter. The hardware elements of the computing device or host 300 may cooperate in ways well understood in the art of machine computing. In addition, input devices may be integrated with or in communication with the computing device or host 300. The computing device or host 300 may have any form-factor or may be used in any type of encompassing device. The computing device or host 300 may be in the form of a handheld device such as a smart-phone, a tablet computer, a gaming device, a server, a rack-mounted or backplaned computer-on-a-board, a system-on-a-chip, or others.

Embodiments and features discussed above can be realized in the form of information stored in volatile or non-volatile computer or device readable storage hardware. This is deemed to include at least hardware such as optical storage (e.g., compact-disk read-only memory (CD-ROM)), magnetic media, flash read-only memory (ROM), or any means of storing digital information in to be readily available for the processing hardware 328. The stored information can be in the form of machine executable instructions (e.g., compiled executable binary code), source code, byte-code, or any other information that can be used to enable or configure computing devices to perform the various embodiments discussed above. This is also considered to include at least volatile memory such as random-access memory (RAM) and/or virtual memory storing information such as central processing unit (CPU) instructions during execution of a program carrying out an embodiment, as well as non-volatile media storing information that allows a program or executable to be loaded and executed. The embodiments and features can be performed on any type of computing device, including portable devices, workstations, servers, mobile wireless devices, and so on.

CONCLUSION

Embodiments and features discussed above can be realized in the form of information stored in volatile or non-volatile computer or device readable media. This is deemed to include at least media such as optical storage (e.g., compact-disk read-only memory (CD-ROM)), magnetic media, flash read-only memory (ROM), or any current or future means of storing digital information. The stored information can be in the form of machine executable instructions (e.g., compiled executable binary code), source code, bytecode, or any other information that can be used to enable or configure computing devices to perform the various embodiments discussed above. This is also deemed to include at least volatile memory such as random-access memory (RAM) and/or virtual memory storing information such as central processing unit (CPU) instructions during execution of a program carrying out an embodiment, as well as non-volatile media storing information that allows a program or executable to be loaded and executed. The embodiments and features can be performed on any type of computing device, including portable devices, workstations, servers, mobile wireless devices, and so on.

The invention claimed is:

1. A method performed by one or more computing devices comprised of storage hardware, the method comprising:
    executing a space-modelling cloud service, the space-modelling cloud service providing space model elements to enable client devices accessing the space-modelling cloud service to instantiate and construct space models comprised of instances of the space model elements, the space model elements including nodes having predefined types corresponding to building elements and sensor representations for representing sensors in buildings, the space models configured to allow custom tenant code to be attached to space models to perform actions based on state of the space models;
    providing, to the space-modelling cloud service, a map file, the map file comprising two-dimensional or three-dimensional geometric data items collectively representing layout of a building, the geometric data items comprising two-dimensional or three-dimensional lines and/or polygons;
    parsing, by the space-modelling cloud service, the map file and analyzing the two-dimensional or three-dimensional lines and/or polygons to identify therefrom building elements including rooms, floors, and objects of the building, and to identify therefrom containment relationships between the elements, each containment relationship corresponding to a determination that geometric properties of the two-dimensional or three-dimensional lines and/or polygons indicate geometric containment between two or more of the identified building elements; and
    building, by the space-modelling service, a space model comprising a space graph, the space graph comprising nodes that correspond to the respectively identified building elements and links forming parent-child relationships between nodes that correspond to the identified containment relationships, wherein the nodes are added according to the identified building elements and the links are added according to the identified containment relationships, each node comprising respective node metadata, each node comprising a respective node type that corresponds to a type of physical space.

2. A method according to claim 1, the method further comprising determining types of the identified building elements and automatically setting or selecting types of the nodes accordingly.

3. A method according to claim 1, wherein the types and/or containment relationships are determined by correlating text data with building elements.

4. A method according to claim 3, wherein the text data is obtained from optical recognition of image data in the map file, from metadata items in the map file that are associated with respective geometric data items, and/or from results of a query submitted to an external application or network service.

5. A method according to claim 1, wherein the map file comprises non-raster image data.

6. A method according to claim 1, further comprising updating the map file by correlating indications of respective nodes with respective building elements.

7. A method according to claim 6, wherein the updating the map file comprises, according to which of the correlated building elements are correlated with the indications, and storing the indications in the map file in association with whichever of the geometric data items correspond to the correlated building elements.

8. A method according to claim 7, further comprising displaying a graphical user interface comprised of a rendering of the map file, the rendering of the map file including graphics representing nodes according to the indications added to the map file.

9. A computing system comprising:
    processing hardware in a compute cloud, the compute cloud comprising a space-modelling cloud service;
    storage hardware in the compute cloud, the storage hardware storing instructions that, when executed by the processing hardware, cause the processing hardware to perform a process, the process comprising:
        executing the space-modelling cloud service, the space-modelling cloud service providing space model elements to enable tenants to instantiate and construct space models comprised of instances of the space model elements, the space model elements including nodes having predefined types corresponding to building elements and sensor representations for representing sensors in buildings, the space-modelling cloud service also enabling custom tenant code to be attached to space models to perform actions based on state of the space models;
        receiving, via a network, from a tenant device operated by a tenant of the compute cloud, a map file submitted to the space-modelling cloud service by the tenant device, and storing the map file in the storage hardware, the map file comprising two-dimensional or three-dimensional non-raster geometric constructs corresponding to the geometric arrangement of structural building features and objects represented in the map file in relation to the geometric constructs in the map file, wherein the geometric constructs are arranged such that there are geometric containment relationships therebetween that correspond to building containment relationships between the structural building features;
        responsive to a request from the tenant device, analyzing the geometric constructs and arrangement thereof in the map file to identify (i) which geometric constructs represent which building elements, the building elements including rooms and floors in the map file and (i) the containment relationships between the geometric constructs and their correspondence to containment relationships between the building elements;

based on the identifying, automatically constructing a new space model by instantiating nodes in the new space model having types selected from among the predefined types and by forming parent-child links between the nodes in correspondence with the identified containment relationships between the building elements; and making the new space model available to the tenant from the space-modelling cloud service.

10. A computing device according to claim 9, the process further comprising providing, by the space-modelling cloud service, a user interface comprised of a rendering of the map file, the rendering including graphics displayed according to links to nodes in the new space model.

11. A computing system according to claim 9, wherein some of the nodes of the new space model comprise device representations that represent sensors, the device representations configured to receive sensor measures from physical sensors in a building corresponding to the new space model.

12. A computing device according to claim 11, wherein space-modelling cloud service includes a user interface to enable manual addition of the device representations to the new space model.

13. A computing device according to claim 11, the process further comprising receiving a raster image from the tenant device and performing image processing on the raster image file to produce the map file.

14. A computing device according to claim 9, the process further comprising using metadata obtained based on the map file to select the predefined types.

15. A computing device according to claim 9, the process further comprising determining the predefined type of a node of the new space model based on information about a device representation contained by the node.

16. A method performed by one or more computing devices comprised of one or more storage devices and one or more processors, the method comprising automatically:

executing a space-modelling cloud service, the space-modelling cloud service providing space model elements to enable client devices accessing the cloud service to instantiate and construct space models comprised of instances of the space model elements, the space model elements including nodes having predefined types corresponding to building elements and sensor representations for representing sensors in buildings, the space models configured to allow custom tenant code to be attached to space models to perform actions based on state of the space models;

accessing, by the processors executing the space-modelling cloud service, geometric map data in the storage devices, the geometric map data comprising geometric constructs comprising lines and/or polygons provided to the space-modelling cloud service by a client device, wherein the geometric constructs model respective elements a building, and wherein the geometric constructs are arranged to have geometric containment relationships therebetween that model containment relationships between elements of a building;

accessing, by the one or more processors accessing the space-modelling cloud service, building metadata that is associated with the map file;

instantiating, by the space-modelling cloud service, a new space model comprising a graph constructed to model the building, and storing the new space model on the one or more storage devices;

constructing, by the space-modelling service, the graph to model the building by adding nodes to the graph to represent respective elements of the building identified according to the lines and/or polygons in the geometric map data;

further constructing, by the space-modelling cloud service, the graph to model the building by adding to the graph links between the nodes added to the graph, the links added according to containment relationships between the elements of the building as determined by identifying corresponding geometric containment relationships in the lines and/or polygons in the geometric map data;

typing, by the space-modelling cloud service, the nodes and populating the nodes with building metadata from the building metadata associated with the map file; and providing to the client device, by the space-modelling cloud service, the new space model.

17. A method according to claim 16, wherein the metadata comprises metadata from a map file that contains the geometric map data and/or metadata from a source external to the map file.

18. A method according to claim 16, wherein the elements of the building are identified in the map data based at least in part on the accessed metadata.

19. A method according to claim 16, wherein the typing and/or containment relationships are inferred at least in part from the accessed metadata.

20. A method according to claim 16, further comprising, based on the map data and/or the metadata about the building, identifying elements in the map data that correspond to devices or fixtures and adding respective nodes to the graph by linking such nodes to corresponding nodes representing building elements determined to contain the identified elements.

* * * * *